US012575422B2

(12) United States Patent
Moallem et al.

(10) Patent No.: US 12,575,422 B2
(45) Date of Patent: Mar. 10, 2026

(54) SEMICONDUCTOR PACKAGE WITH ANTENNA

(71) Applicant: Texas Instruments Incorporated, Dallas, TX (US)

(72) Inventors: Meysam Moallem, Plano, TX (US); Michael Paul Pierce, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1308 days.

(21) Appl. No.: 16/598,483

(22) Filed: Oct. 10, 2019

(65) Prior Publication Data

US 2020/0118949 A1 Apr. 16, 2020

Related U.S. Application Data

(60) Provisional application No. 62/746,344, filed on Oct. 16, 2018.

(51) Int. Cl.
*H01L 23/16* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC .............. H01L 23/16; H01L 23/49816; H01L 23/49822; H01L 23/49838; H01L 23/562;
(Continued)

(56) References Cited

U.S. PATENT DOCUMENTS

| | | | |
|---|---|---|---|
| 5,895,967 A | 4/1999 | Stearns et al. | |
| 6,624,003 B1 * | 9/2003 | Rice ........................ | B81B 7/007 |
| | | | 438/106 |

(Continued)

OTHER PUBLICATIONS

Desai et al., How antenna-on-package design simplifies mmWave sensing in buildings and factories, Texas Instruments Incorporated, Dallas, Texas, Jul. 2019.

(Continued)

*Primary Examiner* — Joshua Benitez Rosario
*Assistant Examiner* — John Lin
(74) *Attorney, Agent, or Firm* — Ronald O. Neerings; Frank D. Cimino

(57) ABSTRACT

A package includes a substrate, a conductive layer on a first surface of the substrate forming a set of antennas, and a semiconductor die forming communication channels for the antennas, each of the communication channels being electrically coupled to the antennas by way of a redistribution layer that includes the substrate, the semiconductor die being mounted on either the first surface or an opposing second surface of the substrate. The package further includes a set of electrical contacts on the second surface of the substrate, the redistribution layer further coupling the set of electrical contacts to the semiconductor die. The package further includes a stiffening layer over the first surface of the substrate, the stiffening layer forming gaps over the antennas such that the antennas are on an outer surface of the package.

32 Claims, 6 Drawing Sheets

(51) Int. Cl.

| | |
|---|---|
| *H01L 23/00* | (2006.01) |
| *H01L 23/498* | (2006.01) |
| *H01L 23/66* | (2006.01) |
| *H01Q 1/22* | (2006.01) |

(52) U.S. Cl.
CPC ........ *H01L 23/16* (2013.01); *H01L 23/49816* (2013.01); *H01L 23/49822* (2013.01); *H01L 23/49838* (2013.01); *H01L 23/562* (2013.01); *H01Q 1/2283* (2013.01); *H01L 2223/6677* (2013.01)

(58) Field of Classification Search
CPC . H01L 23/66; H01L 21/4853; H01L 21/4857; H01L 2223/6677; H01Q 1/2283; H01Q 21/061; H01Q 21/12
See application file for complete search history.

(56) References Cited

U.S. PATENT DOCUMENTS

| | | | |
|---|---|---|---|
| 7,365,683 B2 | 4/2008 | Park | |
| 8,138,588 B2 | 3/2012 | Haskett | |
| 8,942,643 B2 | 1/2015 | Ginsburg et al. | |
| 9,646,906 B2 | 5/2017 | Cook et al. | |
| 9,647,329 B2 | 5/2017 | Herbsommer et al. | |
| 9,666,553 B2 | 5/2017 | Murugan et al. | |
| 2015/0364816 A1* | 12/2015 | Murugan | H01L 23/66 343/905 |
| 2018/0226314 A1* | 8/2018 | Chen | H01L 23/66 |
| 2019/0013288 A1 | 1/2019 | Kim et al. | |

OTHER PUBLICATIONS

Lovescu et al., The fundamentals of millimeter wave sensors, Texas Instruments Incorporated, Dallas, Texas, May 2017.

* cited by examiner

100

160

140

110

150

202 — ATTACH STIFFENING LAYER OVER SURFACE OF DIELECTRIC SUBSTRATE INCLUDING ANTENNAS

204 — ARRANGE SEMICONDUCTOR DIE ON DIE ATTACH SITE OF DIELECTRIC SUBSTRATE

206 — APPLY SOLDER BALL ARRAY TO ELECTRICAL CONTACTS ON OPPOSING SURFACE OF DIELECTRIC SUBSTRATE

208 — SINGULATE PACKAGE FROM AN ARRAY OF INTERCONNECTED PACKAGES

SEMICONDUCTOR PACKAGE WITH ANTENNA

This application claims the benefit of and priority to U.S. Provisional Application No. 62/746,344, filed Oct. 16, 2018, which is hereby fully incorporated herein by reference.

TECHNICAL FIELD

This disclosure relates to semiconductor packages.

BACKGROUND

Semiconductor devices including active and/or passive components may be manufactured into round wafers sliced from elongated cylinder-shaped single crystals of semiconductor elements or compounds. The diameter of these solid-state wafers may reach up 12 inches or more. Individual semiconductor dies are typically singulated from a round wafer by sawing streets in X- and Y-directions through the wafer in order to create rectangularly shaped discrete pieces from the wafers.

Each semiconductor die includes at least one active or passive component and die pads serving to facilitate electric connections to the component(s) of the semiconductor die. Semiconductor dies include many large families of electronic components; examples include active devices such as diodes and transistors like field-effect transistors, passive devices such as resistors and capacitors, and integrated circuits, which can include far more than a million active and passive components.

After singulation, one or more semiconductor dies are attached to a discrete supporting substrate such as a metal leadframe or a rigid multi-level substrate laminated from a plurality of metallic and insulating layers. The conductive traces of the leadframes and substrates are connected to the die pads, typically using bonding wires or metal bumps such as solder bumps.

The assembled semiconductor dies, leadframes and/or substrates may be encapsulated to form discrete robust packages, which frequently employ hardened polymeric compounds and are formed by techniques such as transfer molding. The assembly and packaging processes are performed either on an individual basis or as part of batch processes including a strip or array of semiconductor dies on a corresponding strip or array of leadframes and/or through a single loading of a mold press.

Semiconductor technology continues trends towards miniaturization, integration, and speed. Integration of antennas and functional circuity within a common package are sometimes referred to as antenna-on-package (AoP) or antenna-in-package (AiP). Packages with integrated antennas may be scaled to incorporate a variety of different wireless sensing and/or transmission standards. However, advantages of packages with integrated antennas are most apparent for applications requiring relatively small antennas, such as Wi-Fi, near-field communication (NFC), and millimeter wave (mmWave) applications.

In radio frequency (RF) sensor-based systems, antenna configuration affects the maximum object detection range, the field of view, and the resolution, which is important for several applications. With a single sensor and the right antenna configuration, an industrial system can cover a wide area for simultaneous object detection. Traditionally, mmWave antennas have been designed on a printed circuit board (PCB) using substrates with advanced materials that support efficiency at high-frequencies, such as polytetrafluoroethylene based-substrates, to deliver high-accuracy sensing. Although effective, such system designs require RF expertise to design and manufacture an antenna to work alongside the sensor. Packages with integrated antennas may reduce system complexity and manufacturing costs by eliminating the need for standalone antennas. Such sensing systems may be utilized for robotics, industrial 3D sensing, and automotive applications including driver-assist and self-driving systems.

mmWave systems generally operate in the spectrum between 24 GHz-300 GHz. In different applications, mmWave systems may be utilized for data transmission, such as with cellular networks, or in radar sensing technology for detection of objects. Due to short wavelengths of mmWave signals, system components, such as antennas, may be of relatively small size. In radar systems, short wavelengths also facilitate high resolution. For example, a mmWave radar system that resolves distances has a theoretical accuracy in the mm range at 60-64 GHz and 76-81 GHz. The short wavelengths of mmWave signals also allow functionality in unfavorable environmental conditions such as rain, fog, dust and snow, and can penetrate certain materials such as plastic, drywall, and clothing.

BRIEF SUMMARY

Semiconductor packages with integrated antennas disclosed herein include a substrate with a conductive layer forming one or more antennas, and a semiconductor die forming communication channels for each of the antennas. The packages also include a stiffening layer forming gaps over each antenna such that antennas are on an outer surface of the package. The stiffening layer may improve package rigidity without significantly interfering with the operation of the antennas. In some specific examples, the stiffening layer may be formed from a conductive material, and gaps over the antennas may function as wave guides. In contrast to dielectric mold material covering antennas, a stiffening layer including with gaps over the antennas may improve rigidity with limited or no adverse impacts to antenna performance.

In one example, a package includes a substrate including a first surface and a second surface opposing the first surface, a conductive layer on the first surface of the substrate forming a set of antennas, and a semiconductor die forming communication channels for each of the set of antennas, each of the communication channels being electrically coupled to an associated antenna of the set of antennas by way of a redistribution layer that includes the substrate, the semiconductor die being mounted on either the first surface or the second surface of the substrate. The package further includes a set of electrical contacts on the second surface of the substrate, the redistribution layer further coupling the set of electrical contacts to the semiconductor die. The package further includes a stiffening layer over the first surface of the substrate, the stiffening layer forming gaps over each antenna of the set of antennas such that each antenna of the set of antennas is on an outer surface of the package.

In another example, a method of forming a package includes attaching a stiffening layer over a first surface of a substrate of a redistribution layer, the substrate including a first surface and a second surface opposing the first surface with a conductive layer on the first surface of the substrate forming a set of antennas. After attaching the stiffening layer over the first surface of the substrate, the stiffening layer forms gaps over each antenna of the set of antennas such that each antenna of the set of antennas remains exposed on an outer surface of the package. The method further includes arranging a semiconductor die on a die attach site of the redistribution layer. The semiconductor die forms communication channels for each of the set of antennas. Arranging the semiconductor die on the die attach site electrically couples the communication channels of the semiconductor die to the set of antennas of the conductive layer on the first surface of the substrate via the redistribution layer.

In another example, a package includes a substrate including a first surface and a second surface opposing the first surface, a conductive layer on the first surface of the substrate forming a set of antennas, and a semiconductor die forming communication channels for each antenna of the set of antennas, each of the communication channels being electrically coupled to an associated antenna of the set of antennas by way of a redistribution layer that includes the substrate, the semiconductor die being mounted on either the first surface or the second surface of the substrate. The communication channels include at least one millimeter wave (mmWave) transmit channel and at least one mmWave receive channel. The package further includes a set of electrical contacts on the second surface of the substrate, the redistribution layer further coupling the set of electrical contacts to the semiconductor die. Portions of the conductive layer outside the antennas are electrically coupled to a ground electrical contact of the set of electrical contacts by way of ground conductors formed on the substrate. The package further includes a solder ball array over the set of electrical contacts, the solder ball array forming a flip chip ball grid array (FCBGA), and a metal stiffening layer adhered to the first surface of the substrate and electrically connected to grounded portions of the conductive layer outside the antennas, the metal stiffening layer forming gaps over each antenna of the set of antennas such that each antenna of the set of antennas is on an outer surface of the package.

DETAILED DESCRIPTION

As disclosed herein, a semiconductor package with integrated antennas includes a substrate with a conductive layer forming one or more antennas, and a semiconductor die forming communication channels for each of the antennas. Semiconductor packages with integrated antennas disclosed herein include a stiffening layer forming gaps over each antenna such that antennas are on an outer surface of the package. The stiffening layer may improve package rigidity without significantly interfering with the operation of the antennas. In some specific examples, the stiffening layer may be formed from a conductive material, and gaps over the antennas may function as wave guides.

In contrast, semiconductor packages with integrated antennas without stiffening layers lack rigidity and may be more fragile during manufacturing processes and end use, adversely impacting production and reliability compared to the packages with stiffening layers as disclosed herein. A mold layer encasing antennas and semiconductor dies within a common package to may also improve rigidity over design without a mold layer or stiffening layer. However, mold layers may degrade performance of integrated antennas.

Figure 1A:
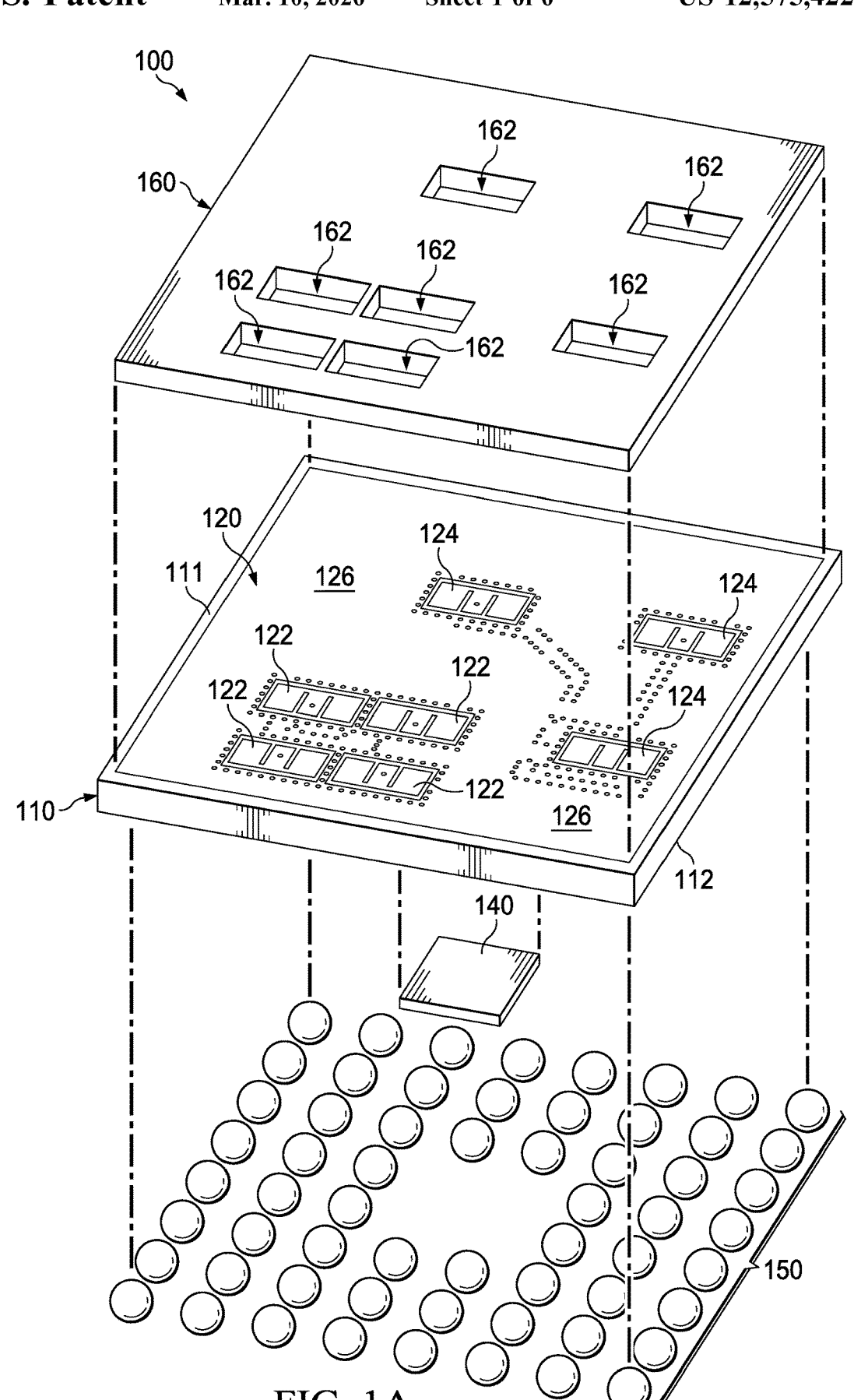
FIGS. 1A-1C illustrate a semiconductor package with integrated antennas including an antenna-side stiffening layer.
Figure 1B:
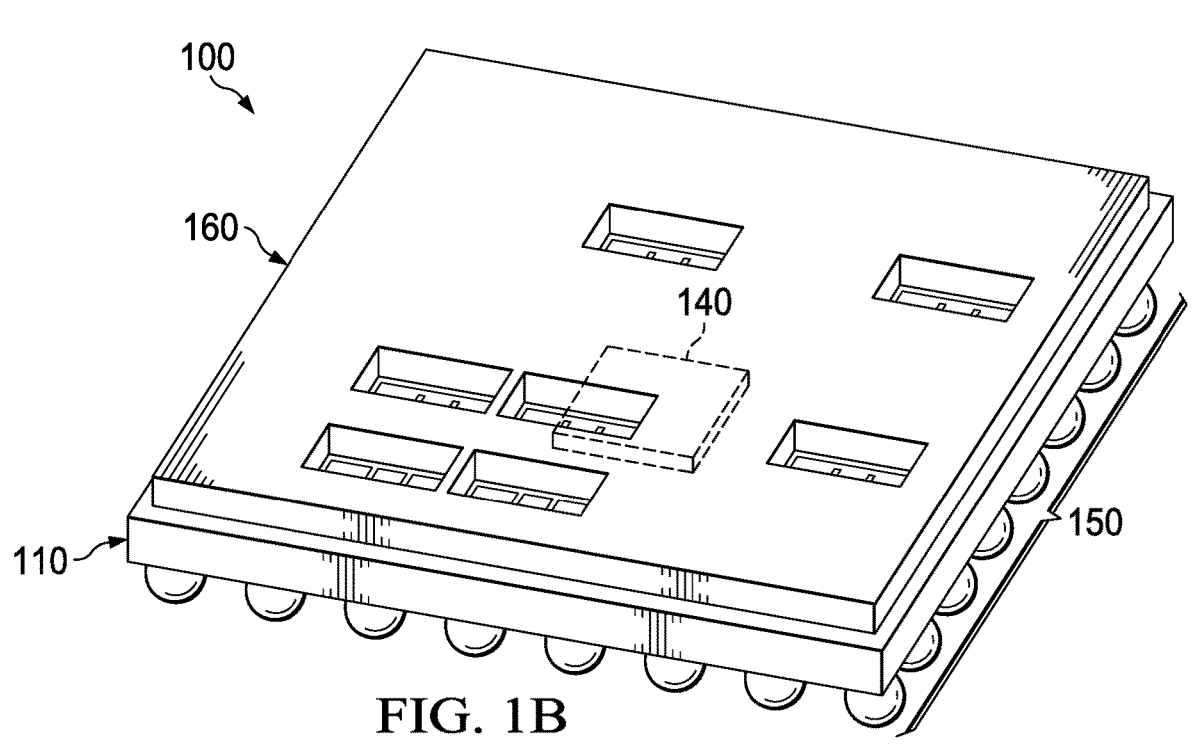
Figure 1C:
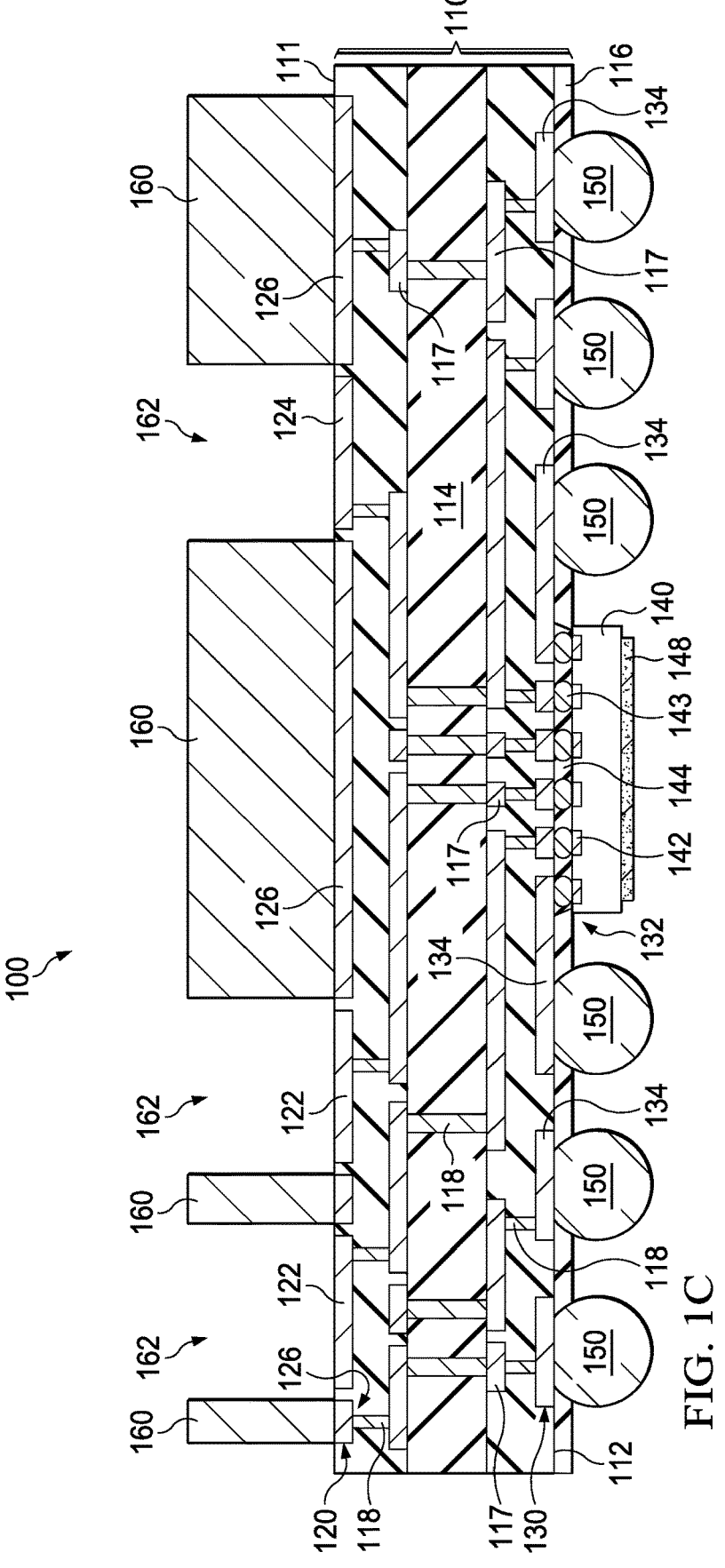

FIGS. 1A-1C illustrate package 100, an example semiconductor package with integrated antennas. More specifically, package 100 includes semiconductor die 140, redistribution layer 110, conductive antenna layer 120 with antennas 122, 124, and an antenna-side stiffening layer 160. In particular, FIG. 1A is an exploded view of package 100, FIG. 1B is a perspective view of package 100, and FIG. 1C is a conceptual cut-away view of package 100.

Redistribution layer 110 includes dielectric substrate 114 and electrical conductors formed on and within dielectric substrate 114. The electrical conductors of redistribution layer 110 include external conductive layer 130 on surface 112 of dielectric substrate 114, as well as internal conductive layers 117 and internal conductive vias 118, which extend within dielectric substrate 114. Internal conductive layers 117 include metal traces in two dimensional patterns interconnected with internal conductive vias 118. In turn, internal conductive vias 118 provide electrical connections between internal conductive layers 117, conductive antenna layer 120, and external conductive layer 130.

Dielectric substrate 114, may represent a laminate substrate, and internal conductive layers 117 may extend between the laminate layers of dielectric substrate 114. The quantity and layout of internal conductive layers 117 and internal conductive vias 118 of redistribution layer 110 as illustrated in FIG. 1C is merely conceptual, and any number of configurations for the conductors of redistribution layer 110 are possible. In the example of FIG. 1C, dielectric substrate 114 is illustrated as a three-layer substrate with two internal conductive layers 117. Other examples may include a different number of layers for dielectric substrate 114, such as a six-layer dielectric substrate with five internal conductive layers.

A variety of materials may be selected for dielectric substrate 114, and each layer may include the same or different material compositions. As non-limiting examples, dielectric substrate 114 may be formed from ceramics or organic materials, including inert polymeric materials such as polyimide. Other organic materials, such as resins, including epoxy resin, polyurethane resin, or silicone resin may also be selected for dielectric substrate 114. In some examples various layers of dielectric substrate 114 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, increase thermal conductivity, and/or increase elastic modulus. Particulate fillers may be selected to reduce strength characteristics such as tensile strength and flexural strength compared to the resin base materials.

In comparison to examples with an organic laminate substrate, a ceramic substrate may provide a coefficient of thermal expansion (CTE) closer to the CTE of semiconductor die 140 than a laminate substrate. The closer CTE of a ceramic substrate, as opposed to an organic laminate substrate, to the CTE of semiconductor die 140 may limit thermally induced displacement between semiconductor die 140 and dielectric substrate 114. In addition, a ceramic substrate may support additional heat dissipation of semiconductor die 140 as compared to a laminate substrate.

In the example of package 100, conductive antenna layer 120 on surface 111 of dielectric substrate 114 forms three transmit antennas 124 and four receive antennas 122. Other packages may include more or less antennas 122, 124, such as at least one transmit antenna 124 and at least one receive antenna 122, or more than three transmit antennas 124 and/or more than four receive antennas 122. Conductive antenna layer 120 on surface 111 of dielectric substrate 114 also forms grounded portions 126, which are outside the areas of antennas 122, 124. Grounded portions 126 are electrically coupled to a ground electrical contact of electrical contacts 134 by way of ground conductors formed in dielectric substrate 114, such as portions of external conductive layer 130 on surface 112 of dielectric substrate 114, as well as portions of internal conductive layers 117 and one or more of internal conductive vias 118. Each antenna 122, 124 is electrically isolated from the other antennas 122, 124 and from grounded portions 126.

Package 100 further includes a stiffening layer 160 over surface 111 of dielectric substrate 114. For example, stiffening layer 160 forms gaps 162 over each antenna 122, 124 such that each antenna 122, 124 is on an outer surface of package 100. In the illustrated example, gaps 162 in stiffening layer 160 include separate apertures over each antenna 122, 124. In other examples, a stiffening layer aperture may cover more than one antenna, such as a single aperture for all of the four receive antennas 122 or another combination of antennas.

In some examples, stiffening layer 160 may be formed from an electrically conductive material. In such examples, stiffening layer 160 may be electrically connected to grounded portions 126 of conductive antenna layer 120 outside of antennas 122, 124. In some specific examples, stiffening layer 160 is a metal stiffening layer with higher thermal conductivity than dielectric substrate 114. A metal stiffening layer 160 supports heat dissipation of package 100, improving thermal performance of package 100 compared to examples in which stiffening layer 160 has a lower thermal conductivity or alternative designs without an antenna-side stiffening layer.

Stiffening layer 160 may represent a patterned metal stiffening layer. The patterned metal may be formed by cutting, such as laser cutting, or stamping a thin sheet of metal to form gaps 162. Attaching stiffening layer 160 to redistribution layer 110 may include applying a thermally conductive adhesive, such as thermal interface material, electrically conductive epoxy or electrically non-conductive epoxy, between grounded portions 126 of conductive antenna layer 120 and stiffening layer 160 or reflowing solder at the interface of grounded portions 126 of conductive antenna layer 120 and stiffening layer.

The nominal thickness of the metal sheet used to form stiffening layer 160 may be selected to provide desired stiffness and robustness for package 100. In particular examples, the nominal thickness of stiffening layer 160 and the metal sheet from which it was formed may be within a range of 0.2 millimeters (mm) to 0.6 mm. This example range is presented as a nonlimiting example suitable for some particular applications. With some materials, such a copper alloy or other metals, the rigidity of stiffening layer 160 for thicknesses below 0.2 mm may limit the effectiveness of stiffening layer 160 at mitigating package warpage. Likewise, for some materials such as copper, at higher thicknesses, thermal expansion of the stiffening layer may dominate thermal expansion of semiconductor die 140 and dielectric substrate 114, causing increased displacement during thermal cycling of package 100. Such displacement is undesirable and may cause solder cracking or even conductor fracture, for example, as a result of thermal/power cycling over time and/or heating during attachment of package 100 to other system components, such as solder attachment of package 100 to a PCB.

The thickness of the redistribution layer 110 may be similar to that of stiffening layer 160, such as within a range of 0.1 mm to 1 mm, such as about 0.20 mm, 0.40 mm, or 0.80 mm, such as within a range of 0.15 mm to 0.50 mm. At thicknesses below 0.1 mm, or even below 0.15 mm, insulation between conductive layers of redistribution layer 110 may not be effective depending on electrical currents and substrate materials selected, and at thicknesses above 1 mm, or even above 0.50 mm, package 100 may have sufficient rigidity without the addition of stiffening layer 160 for many practical applications.

In this manner, the thickness of stiffening layer 160 may represent a significant portion of the overall thickness of package 100, such as at least 25 percent of the overall thickness of package 100, or even more than 50 percent of the overall thickness of package 100. As referred to herein, the thicknesses of package 100, redistribution layer 110, and stiffening layer 160 are measured normal to surface 111 of dielectric substrate 114.

In examples in which stiffening layer 160 is formed from an electrically conductive material, the addition of stiffening layer 160 over conductive antenna layer 120 has little impact on antenna characteristics such as efficiency, radiation pattern and impedance bandwidth. Using a metal structure as opposed to a dielectric structure for stiffening layer 160 also mitigates risk of exciting dielectric substrate 114 or resonant modes that can negatively impact electrical performance. With such examples, gaps over antennas 122, 124 may function as wave guides. As a wave guide, stiffening layer 160 may alter the gain and/or directional focus of antennas 122, 124.

Stiffening layer 160 provides rigidity for package 100 without adverse effects on the operation of antennas 122, 124. The rigidity provided by stiffening layer 160 may improve the robustness and reliability of package 100 during its manufacture and use without the need for an overmold material for to physically support the components of package 100. With no mold material or encapsulant covering semiconductor die 140 and redistribution layer 110, package 100 represents a moldless package.

In various nonlimiting aspects, stiffening layer 160 may limit warpage caused by differences between the thermal coefficient of expansion for dielectric substrate 114 and the thermal coefficient of expansion for semiconductor die 140, which may be a silicon die for example. In another nonlimiting aspect, stiffening layer 160 may increase the stiffness of package 100 and its ability to resist bending forces. Such bending forces may otherwise degrade or break electrical connections within package 100, such as connections between semiconductor die 140 and die attach site 132 and/or conductors of redistribution layer 110, such as internal conductive layers 117, internal conductive vias 118 and external conductive layer 130.

External conductive layer 130 on surface 112 of substrate 114 forms electrical contacts of die attach site 132 as well as electrical contacts 134 for a solder ball array 150. Electrical contacts 134 of external conductive layer 130 surround die attach site 132. Like internal conductive layers 117, external conductive layer 130 may also include metal traces in two dimensional patterns as needed to provide electrical connections as well as mitigate interference of antennas 122, 124 and the other components of package 100.

Package 100 may further include an electrically insulating layer 116 over conductive layer 130 on surface 112 of substrate 114. Electrically insulating layer 116 covers electrical traces of external conductive layer 130 and includes openings for electrical contacts of die attach site 132 and electrical contacts 134. In some examples, electrically insulating layer 116 may represent a solder mask layer. Solder bumps of solder ball array 150 are positioned on electrical contacts 134 at the openings of electrically insulating layer 116 to facilitate a connection with an external device, through a solder reflow process for example. For example, solder ball array 150 may represent a ball grid array. In various examples, solder ball array 150 may conform to various configurations, such as a flip chip ball grid array (FCBGA), or wire bond fine-pitch ball grid array (FBGA). Note that the number of solder bumps in solder ball array 150 on package 100 has been reduced for simplicity in FIG. 1C, as have the number of antennas 122, 124.

The active side of semiconductor die 140 is mounted to redistribution layer 110 at die attach site 132 of external conductive layer 130 with solder bumps 143 at die pads 142 and secured with die attach 144, which represents an underfill at the interface of semiconductor die 140 and redistribution layer 110. As used herein, an active side of a semiconductor die is a side including conductive die pads which serve as terminals to connect the components of the semiconductor die to external elements, such as a PCB. For example, semiconductor die 140 includes metallized die pads 142 on its active side. Die pads 142 may be aluminum pads or copper pads for example. The die pads may include plated bumps, such as copper plated bumps on copper pads.

The active side of semiconductor die 140 is protected by an electrically insulating layer (not shown) of an inert polymeric material such as polyimide, which may have been applied to a surface of a semiconductor wafer used to form semiconductor die 140 before wafer singulation. The electrically insulating layer of semiconductor die 140 has a plurality of openings to expose die pads 142. FIG. 1C is merely a conceptual illustration and various examples may include any number of die pads 142 on semiconductor die 140 with a corresponding pattern of electrical contacts forming die attach site 132 of conductive layer 130.

In addition to connecting semiconductor die 140 to antennas 122, 124 on surface 111 of dielectric substrate 114, redistribution layer 110 further connects semiconductor die 140 to electrical contacts 134 and solder ball array 150. Package 100 provides a fan-out configuration in that the set of electrical contacts 134 on external surface 112 of redistribution layer 110 forms an array covering an area larger than die pads 142 on active side of semiconductor die 140. While semiconductor die 140 is on the opposite surface 112 of redistribution layer 110 relative to conductive antenna layer 120, in other examples, a semiconductor die 140 may be mounted on the same side of a substrate with a conductive antenna layer 120, such as discussed with respect to package 300.

Semiconductor die 140 includes an integrated circuit providing channels for antennas 122, 124. As best illustrated in FIG. 1C, semiconductor die 140 and its integrated circuit channels are electrically connected to antennas 122, 124 via redistribution layer 110.

The passive side of semiconductor die 140 includes a thermal interface material 148 to improve heat dissipation.

When mounting package 100 on an external component, such as PCB, thermal interface material 148 may be positioned against a thermally conductive element, such as metal or ceramic heat sink. In various examples, thermal interface material 148 may represent a thermal paste or thermal tape. In some examples, thermal interface material 148 may not be included with package 100 but may be added as part of the installation of package 100 on an external component. In addition to or as an alternative to thermal interface material 148, solder ball array 150 may utilize thermal solder balls to facilitate heat transfer to an external board. In some examples, thermal interface material 148 maybe omitted if not required for cooling package 100.

In particular examples, package 100 may utilize millimeter wave (mmWave) technology. In such examples, communication channels of semiconductor die 140 include at least one mmWave transmit channel and at least one mmWave receive channel, according to configuration of package 100. Conductive antenna layer 120 includes antennas configured for mmWave frequencies corresponding to the mmWave channels, such as least three mmWave transmit antennas 124 and at least four mmWave receive antennas 122. Generally, communication channels of semiconductor die 140 will include a single communication channel for each of antennas 122, 124, although in other examples, a single antenna may support more than one communication channel, such as a send and a receive channel. In the illustrated example, semiconductor die 140 may include three mmWave transmit channels and four mmWave receive channels corresponding to the three transmit antennas 124 and the four receive antennas 122 of package 100.

Figure 2:
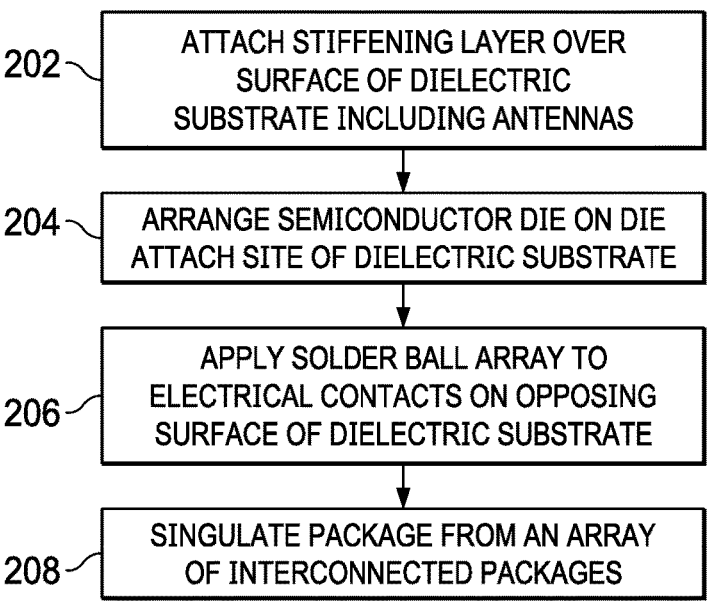
FIG. 2 is a flowchart of a method of manufacturing a semiconductor package including integrated antennas, such as the semiconductor package of FIGS. 1A-1C.

FIG. 2 is a flowchart of a method of manufacturing a semiconductor package including integrated antennas, such as package 100 of FIGS. 1A-1C. For clarity, the techniques of FIG. 2 are described with respect to package 100 and FIGS. 1A-1C; however, the described techniques may also be utilized in the manufacture of other semiconductor packages, including package 300 of FIGS. 3A and 3B.

During the manufacture of a package including an integrated antenna and a stiffening layer, such as package 100, redistribution layer 110, including dielectric substrate 114, internal conductive layers 117, internal conductive vias 118, external conductive layer 130, and electrically insulating layer 116, as well as conductive antenna layer 120 is formed on a carrier, such as a glass carrier. An adhesive, such as thermal or UV sensitive adhesive, may hold the first layer to the carrier, such as electrically insulating layer 116, or external conductive layer 130 during the formation of redistribution layer 110. In order to form redistribution layer 110, including external conductive layer 130, internal conductive layers 117 and internal conductive vias 118, as well as the layers of dielectric substrate 114, patterned metal layers may be alternated with dielectric layers on the carrier. Internal conductive vias 118 may be formed within the dielectric layers by drilling (either mechanical or laser drilling) to create voids, followed by filling the voids with metal, for example, by electroplating or sputtering.

Prior to the removal of redistribution layer 110 with conductive antenna layer 120 from the carrier, stiffening layer 160 is attached over surface 111 of dielectric substrate 114 (FIG. 2, step 202). For example, stiffening layer 160 may be attached to grounded portions 126 of conductive antenna layer 120 using a thermally conductive adhesive, such as thermal interface material, electrically conductive epoxy or electrically non-conductive epoxy, or with a solder reflow. Attaching stiffening layer 160 prior to the removal of redistribution layer 110 from the carrier allows the carrier to hold substrate 114 flat until after it is supported by stiffening layer 160.

After attaching stiffening layer 160 over a surface 111 of a dielectric substrate 114, gaps 162 of stiffening layer 160 are located over each antenna 122, 124 such that each antenna 122, 124 remains exposed on an outer surface of package 100. In examples where stiffening layer 160 is a metal stiffening layer 160, attaching stiffening layer 160 over surface 111 of dielectric substrate 114 electrically connects metal stiffening layer 160 to grounded portions 126 of conductive antenna layer 120 outside of antennas 122, 124.

The assembly of redistribution layer 110, conductive antenna layer 120, and stiffening layer 160 may then be removed from the carrier to facilitate the attachment of semiconductor die 140 on die attach site 132 of redistribution layer 110. Semiconductor die 140 is arranged on die attach site 132 such that die pads 142 are aligned with the electrical contacts of die attach site 132 (FIG. 2, step 204). Prior to the attachment of semiconductor die 140, portions of insulating layer 116 may be removed to expose electrical contacts at die attach site 132, as well as electrical contacts 134.

Electrical connections are formed between die pads 142 and the electrical contacts of die attach site 132. For example, arranging semiconductor die 140 on die attach site 132 of redistribution layer 110 may include processing a set of solder bumps 143 to form electrical connections between the communication channels of semiconductor die 140 and antennas 122, 124. In some examples, solder bumps 143 may be located on die pads 142 as part of semiconductor die 140 before it is arranged on die attach site 132. Arranging semiconductor die 140 on die attach site 132 also electrically couples semiconductor die 140 to electrical contacts 134 via redistribution layer 110. Through this electrical connection, the communication channels of semiconductor die 140 are electrically coupled to antennas 122, 124 via redistribution layer 110. Following the reflow of solder bumps 143, the active side of semiconductor die 140 is further secured with die attach 144, which represents an underfill at the interface of semiconductor die 140 and redistribution layer 110.

Before or after arranging semiconductor die 140 on die attach site 132, solder ball array 150 may be applied to electrical contacts 134 on surface 112 of dielectric substrate 114 to form a solder ball array 150 (FIG. 2, step 206). For example, solder bumps may be positioned on electrical contacts 134 at openings of electrically insulating layer 116 to facilitate a connection with an external device, through a solder reflow process for example. In some examples, a thicker plated metal may first be applied to metal traces of electrically insulating layer 116 to form electrical contacts 134 and/or the electrical contacts of die attach site 132.

In some examples, package 100 may be manufactured as part of a set of at least two packages formed in unison as a panel on a common carrier. For example, redistribution layer 110 may be formed as part of an array of redistribution layers, and stiffening layer 160 may be attached to redistribution layer 110 as part of an array of stiffening layers manufactured from a common sheet attached to the array of redistribution layers in unison.

Following the assembly of redistribution layer 110, stiffening layer 160, and semiconductor die 140 for an array of packages 100, the array of packages 100 may be singulated, for example, by cutting within interconnected portions of the array of redistribution layers 110 (FIG. 2, step 208). Such cutting may also include cutting within interconnected portions of the array of stiffening layers 160 attached over the array of redistribution layers 110. Sawing may include cuts along a grid such that each package 100 has a rectangular profile. Attachment of semiconductor dies 140 may occur before or after singulation.

Figure 3A:
FIGS. 3A and 3B illustrate an alternative package with integrated antennas including an antenna-side stiffening layer.
Figure 3B:
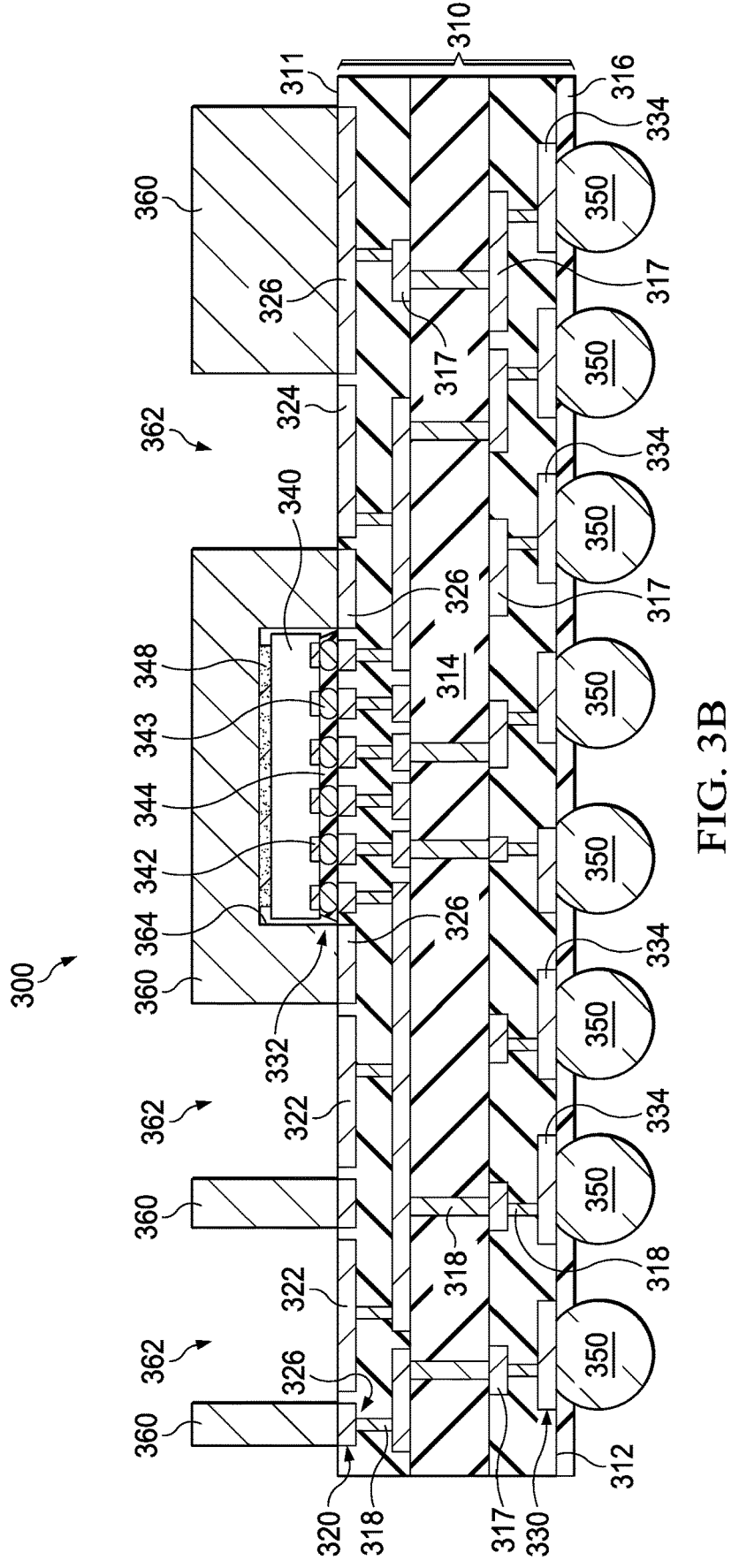

FIGS. 3A and 3B illustrate package 300. In particular, FIG. 3A is an exploded view of package 300, and FIG. 3B is a conceptual cut-away view of package 300. Like package 100, package 300 includes an antenna-side stiffening layer 360. package 300 is substantially similar to package 100 except that semiconductor die 340 is on the same side of redistribution layer 310 as antennas 322, 324 rather than on an opposing side. For brevity, aspects described with respect to package 100 are discussed in limited detail with respect to package 300.

package 300 includes redistribution layer 310, which includes dielectric substrate 314 and electrical conductors formed on and within dielectric substrate 314. The electrical conductors of redistribution layer 310 include external conductive layer 330 on surface 312 of dielectric substrate 314, as well as internal conductive layers 317 and internal conductive vias 318, which extend within dielectric substrate 314. Internal conductive layers 317 include metal traces in two dimensional patterns interconnected with internal conductive vias 318. In turn, internal conductive vias 318 provide internal electrical connections between each of the internal conductive layers 317, as well as conductive antenna layer 320 and external conductive layer 330.

Conductive antenna layer 320 on surface 311 of dielectric substrate 314 forms three transmit antennas 324 and four receive antennas 322. Other packages with integrated antennas may include more or less antennas 322, 324, such as at least one transmit antenna 324 and at least one receive antenna 322, or more than three transmit antennas 324 and/or more than four receive antennas 322. Conductive antenna layer 320 on surface 311 of dielectric substrate 314 also forms grounded portions 326, which are outside the areas of antennas 322, 324.

Conductive antenna layer 320 further forms electrical contacts of die attach site 332. The active side of semiconductor die 340 is mounted to redistribution layer 310 at die attach site 332 of conductive antenna layer 320 with solder bumps 343 and secured with die attach 344, which represents an underfill at the interface of semiconductor die 340 and redistribution layer 310.

package 300 further includes a stiffening layer 360 over surface 311 of dielectric substrate 314. For example, stiffening layer 360 may be attached to grounded portions 326 of conductive antenna layer 320 using a thermally conductive adhesive, such as thermal interface material, electrically conductive epoxy or electrically non-conductive epoxy, or with a solder reflow.

Stiffening layer 360 forms gaps 362 over each antenna 322, 324 such that each antenna 322, 324 is on an outer surface of package 300. In the illustrated example, gaps 362 in stiffening layer 360 include separate apertures over each antenna 322, 324. In other examples, a stiffening layer aperture may cover more than one antenna, such as a single aperture for all of the four receive antennas 322. In some examples, gaps over antennas 322, 324 may function as wave guides, for example, with an electrically conductive stiffening layer 360.

Stiffening layer 360 further forms a recess 364, and semiconductor die 340 is within recess 364. The passive side of semiconductor die 340 includes a thermal interface material 348 which contacts stiffening layer 360 within recess 364 to improve heat dissipation. In various examples, thermal interface material 348 may represent a thermal paste or thermal tape applied to semiconductor die 340 or to recess 364 before stiffening layer 360 is attached to redistribution layer 310.

External conductive layer 330 on surface 312 of substrate 314 forms electrical contacts 334 for a solder ball array 350. Electrical contacts 334 of external conductive layer 330 are located on surface 312 of substrate 314. In various examples, solder ball array 350 may conform to various configurations, such as a flip chip ball grid array (FCBGA), or wire bond fine-pitch ball grid array (FBGA). The number of solder bumps in solder ball array 350 on package 300 has been reduced for simplicity in FIG. 3B, as have the number of antennas 322, 324.

Package 300 may further include an electrically insulating layer 316 over conductive layer 330 on surface 312 of substrate 314. Electrically insulating layer 316 covers electrical traces of external conductive layer 330 and includes openings for electrical contacts 334. In some examples, electrically insulating layer 316 may represent a solder mask layer. Solder bumps of solder ball array 350 are positioned on electrical contacts 334 at the openings of electrically insulating layer 316 to facilitate a connection with an external device, through a solder reflow process for example. For example, solder ball array 350 may represent a ball grid array.

In addition to connecting semiconductor die 340 to antennas 322, 324 on surface 311 of dielectric substrate 314, redistribution layer 310 further connects semiconductor die 340 to electrical contacts 334 and solder ball array 350. package 300 provides a fan-out configuration in that the set of electrical contacts 334 on external surface 312 of redistribution layer 310 forms an array covering an area larger than die pads 342 on active side of semiconductor die 340.

Semiconductor die 340 includes an integrated circuit providing channels for antennas 322, 324. As best illustrated in FIG. 3B, semiconductor die 340 and its integrated circuit channels are electrically connected to antennas 322, 324 via redistribution layer 310. In particular examples, package 300 may utilize mmWave technology as described with respect to package 100.

Figure 4:
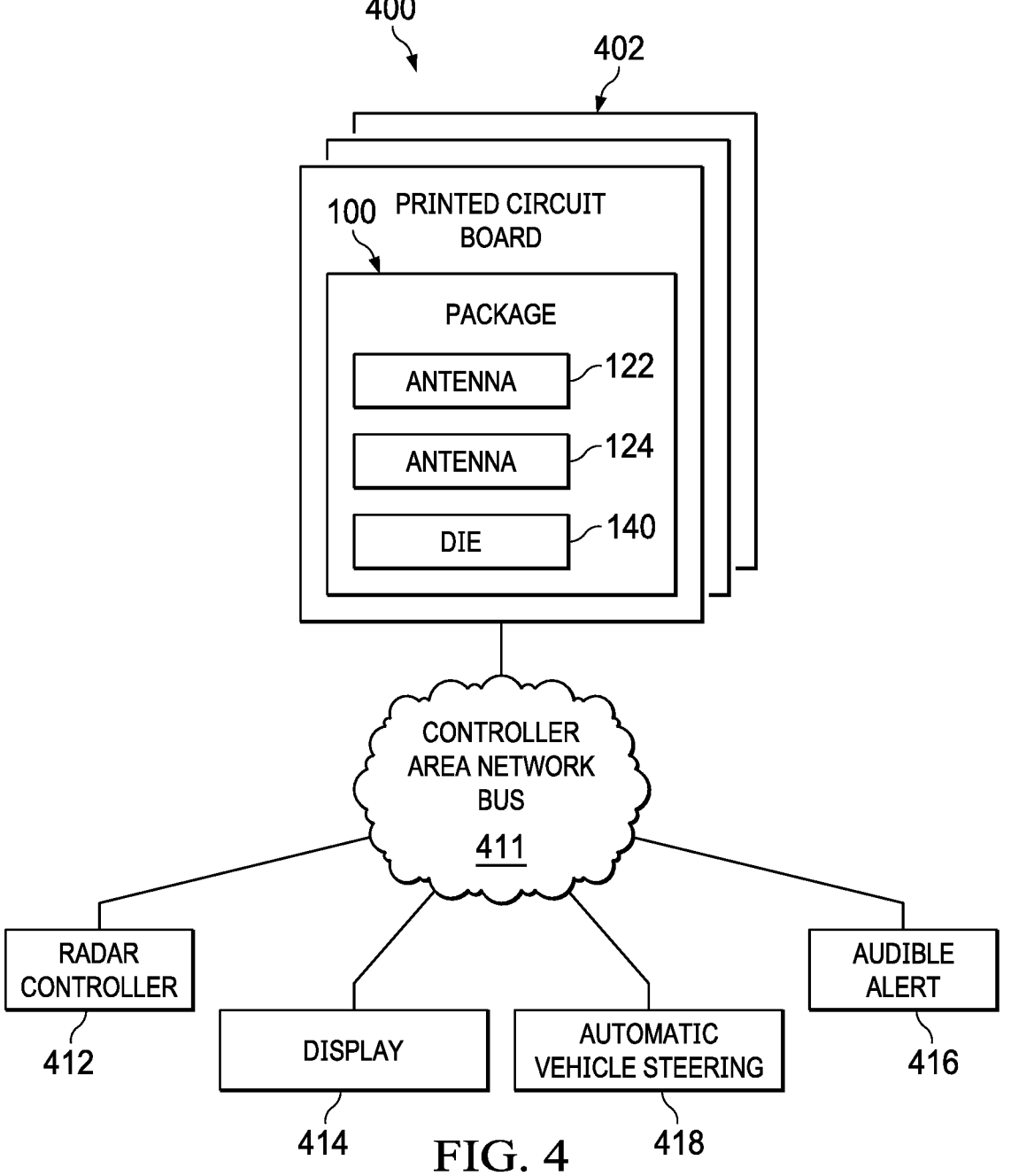
FIG. 4 illustrates a vehicle radar system including semiconductor packages with integrated antenna sensors.

FIG. 4 shows an example of a vehicle radar system 400 including a number of packages 100 with antennas 122, 124 and a semiconductor die 140. As described in further detail with respect to FIGS. 1A-1C, package 100 further includes a stiffening layer forming gaps over each antenna 122, 124. Packages with antenna side stiffening layers, as taught herein, may also be used in other systems and designs, unrelated to automobile radars, such as industrial sensing and non-radar applications including communication applications.

Vehicle radar system 400 includes a plurality of radar packages 100 at different locations around the perimeter of the vehicle to promote collision avoidance. In some cases, as many as thirty or more packages 100, may be deployed in a vehicle radar system. Each package 100 is optionally mounted on a PCB 402 to facilitate a connection to the other components of system 400. In various examples, package 100 may be a wire bond ball grid array (BGA) package, such as a wire bond fine-pitch ball grid array (FBGA) package or a wire bond new fine-pitch ball grid array (nFBGA) to facilitate mounting on PCB 402. System 400 further includes a controller area network (CAN) bus 411 that communicatively couples PCBs 402 to one or more of a radar controller 412, a display 414, an audible alert component 416, and/or an automatic vehicle steering and braking controller 418.

In this example, semiconductor die 140 is an integrated circuit providing radar functionality. In operation, semiconductor die 140 emits a radar signal via transmit channel(s) and antenna(s) 124 radiate the radar signal. If an object is near, the radar signal may reflect off the object and be received by antenna(s) 122 coupled to receive channel(s) of the transmitting semiconductor die 140 or another package 100 of system 400. The receiving package 100 may receive the reflected radar signal from antenna(s) 122, and its semiconductor die 140 may process the reflected radar signal. Semiconductor die 140 of the receiving package 100 transmits digital information about the radar signal or radar return to CAN bus 411.

While each package 100 is shown as including both a receiving antenna 122 and a transmitting antenna 124, in some examples, some packages may be configured only for transmitting signals, while other packages are configured only for receiving transmissions. In the same or different examples, a package may include one or more antennas operably coupled both to transmit channel(s) and to receive channel(s) such that the functionality of the such an antenna is selectable by die 140 and/or CAN bus 411.

Radar controller 412 receives the information from CAN bus 411, processes the information for object detection and, collision risk. If radar controller 412 determines there is a risk of a collision, radar controller 412 may take action to mitigate the risk, either by notifying the driver and/or by activating automatic vehicle control features, such as automatic steering and/or braking.

Driver notification may include sending a warning or notification to display 414, for example commanding display 414 to present an eye-catching signal (display 414 may be located in the center of the dashboard of the vehicle), and/or to audible alert component 416 to sound an audible and/or visual alert. Radar controller 412 may send a command to the automatic vehicle steering and braking controller 418 to take action to avoid the collision, for example to steer away or brake from the impending collision. Such collision avoidance steering commands may be conditioned on radar controller 412 determining, based on inputs from other PCBs 402, that steering and/or braking to avoid the impending collision does not risk a more severe collision.

The specific techniques for semiconductor packages including integrated antennas with stiffening layers, including techniques described with respect to package 100 and package 300, are merely illustrative of the general inventive concepts included in this disclosure as defined by the following claims.

What is claimed is:

1. A package comprising:

a substrate including a first surface and a second surface opposing the first surface;

a conductive layer on the first surface of the substrate forming a set of antennas;

a semiconductor die forming communication channels for each of the set of antennas, each of the communication channels being electrically coupled to an associated antenna of the set of antennas by way of a redistribution layer that includes the substrate, the semiconductor die being mounted on either the first surface or the second surface of the substrate;

a set of electrical contacts on the second surface of the substrate, the redistribution layer further coupling the set of electrical contacts to the semiconductor die; and a stiffening layer over the first surface of the substrate, the stiffening layer forming gaps over each antenna of the set of antennas such that each antenna of the set of antennas is on an outer surface of the package.

2. The package of claim 1, wherein the stiffening layer is a metal stiffening layer.

3. The package of claim 2, wherein the metal stiffening layer is electrically connected to grounded portions of the conductive layer outside of the set of antennas.

4. The package of claim 1, wherein the gaps in the stiffening layer include separate apertures over each antenna of the set of antennas.

5. The package of claim 1,
wherein the substrate has a substrate thickness between 0.1 millimeters (mm) and 1 mm as measured normal to the first surface, and
wherein the stiffening layer has a stiffening layer thickness between 0.2 mm and 0.6 mm as measured normal to the first surface.

6. The package of claim 1, wherein portions of the conductive layer outside of the set of antennas are electrically coupled to a ground electrical contact of the set of electrical contacts by way of ground conductors formed in the substrate.

7. The package of claim 1, wherein the communication channels include at least one transmit channel and at least one receive channel.

8. The package of claim 1, wherein the communication channels include at least three millimeter wave (mmWave) transmit channels and at least four mmWave receive channels.

9. The package of claim 1, wherein the semiconductor die is mounted to the second surface of the substrate.

10. The package of claim 1, further comprising a solder ball array on the set of electrical contacts.

11. The package of claim 1, wherein the package is a moldless package.

12. The package of claim 1, wherein the substrate is a laminate substrate.

13. The package of claim 1, wherein the substrate is a ceramic substrate.

14. The package of claim 1, wherein the semiconductor die is an integrated circuit providing radar functionality.

15. The package of claim 1, wherein a horizontal surface of the stiffening layer is exposed to an environment.

16. The package of claim 15, wherein vertical surfaces of the stiffening layer surrounding the gaps are exposed to the environment.

17. The package of claim 1, wherein the semiconductor die is mounted to the first surface of the substrate.

18. A package comprising:
a substrate including a first surface and a second surface opposing the first surface;
a conductive layer on the first surface of the substrate forming a set of antennas;
a semiconductor die forming communication channels for each antenna of the set of antennas, each of the communication channels being electrically coupled to an associated antenna of the set of antennas by way of a redistribution layer that includes the substrate, the semiconductor die being mounted on either the first surface or the second surface of the substrate;
wherein the communication channels include at least one millimeter wave (mmWave) transmit channel and at least one mmWave receive channel;
a set of electrical contacts on the second surface of the substrate, the redistribution layer further coupling the set of electrical contacts to the semiconductor die;

wherein portions of the conductive layer outside the antennas are electrically coupled to a ground electrical contact of the set of electrical contacts by way of ground conductors formed on the substrate;
a solder ball array over the set of electrical contacts, the solder ball array forming a flip chip ball grid array (FCBGA); and
a metal stiffening layer adhered to the first surface of the substrate and electrically connected to grounded portions of the conductive layer outside the antennas, the metal stiffening layer forming gaps over each antenna of the set of antennas such that each antenna of the set of antennas is on an outer surface of the package.

19. The package of claim 18, wherein a horizontal surface of the stiffening layer is exposed to an environment.

20. The package of claim 19, wherein vertical surfaces of the stiffening layer surrounding the gaps are exposed to the environment.

21. The package of claim 18, wherein the semiconductor die is mounted to the first surface of the substrate.

22. A package comprising:
a stiffening layer on a first surface of a redistribution layer, the redistribution layer including a second surface opposing the first surface with a conductive layer on the first surface forming a set of antennas;
gaps through the stiffening layer over each antenna of the set of antennas such that each antenna of the set of antennas remains exposed on an outer surface of the package;
a semiconductor die on a die attach site of the redistribution layer;
wherein the semiconductor die forms communication channels for each of the set of antennas; and
wherein the semiconductor die electrically couples the communication channels of the semiconductor die to the set of antennas of the conductive layer on the first surface of the substrate via the redistribution layer.

23. The package of claim 22,
wherein the stiffening layer comprises metal.

24. The package of claim 22, wherein the semiconductor die includes a set of solder bumps forming electrical connections between the communication channels of the semiconductor die and the set of antennas of the conductive layer on the first surface of the redistribution layer.

25. The package of claim 24, further comprising solder balls on a set of electrical contacts on the second surface of the redistribution layer forming a ball grid array.

26. The package of claim 22, wherein the redistribution layer electrically couples the semiconductor die to a set of electrical contacts on the second surface of the redistribution layer.

27. The package of claim 22, wherein a horizontal surface of the stiffening layer is exposed to an environment.

28. The package of claim 27, wherein vertical surfaces of the stiffening layer surrounding the gaps are exposed to the environment.

29. The package of claim 22, wherein the semiconductor die is mounted to the first surface of the substrate.

30. A package comprising:
a substrate including a first surface and a second surface opposing the first surface;
a conductive layer on the first surface of the substrate forming a set of antennas;
a semiconductor die forming communication channels for each of the set of antennas, each of the communication channels being electrically coupled to an associated antenna of the set of antennas by way of a redistribution layer that includes the substrate, the semiconductor die being mounted on either the first surface or the second surface of the substrate;

a set of electrical contacts on the second surface of the substrate, the redistribution layer further coupling the set of electrical contacts to the semiconductor die; and a stiffening layer over the first surface of the substrate, the stiffening layer forming gaps over each antenna of the set of antennas such that each antenna of the set of antennas is on an outer surface of the package, wherein a total surface area of the stiffening layer is greater than a total area of the gaps.

31. A package comprising:

a substrate including a first surface and a second surface opposing the first surface;

a conductive layer on the first surface of the substrate forming a set of antennas;

a semiconductor die forming communication channels for each antenna of the set of antennas, each of the communication channels being electrically coupled to an associated antenna of the set of antennas by way of a redistribution layer that includes the substrate, the semiconductor die being mounted on either the first surface or the second surface of the substrate;

wherein the communication channels include at least one millimeter wave (mmWave) transmit channel and at least one mmWave receive channel;

a set of electrical contacts on the second surface of the substrate, the redistribution layer further coupling the set of electrical contacts to the semiconductor die;

wherein portions of the conductive layer outside the antennas are electrically coupled to a ground electrical contact of the set of electrical contacts by way of ground conductors formed on the substrate;

a solder ball array over the set of electrical contacts, the solder ball array forming a flip chip ball grid array (FCBGA); and a metal stiffening layer adhered to the first surface of the substrate and electrically connected to grounded portions of the conductive layer outside the antennas, the metal stiffening layer forming gaps over each antenna of the set of antennas such that each antenna of the set of antennas is on an outer surface of the package, wherein a total surface area of the metal stiffening layer is greater than a total area of the gaps.

32. A package comprising:

a stiffening layer on a first surface of a redistribution layer, the redistribution layer including a second surface opposing the first surface with a conductive layer on the first surface forming a set of antennas;

gaps through the stiffening layer over each antenna of the set of antennas such that each antenna of the set of antennas remains exposed on an outer surface of the package;

a semiconductor die on a die attach site of the redistribution layer;

wherein the semiconductor die forms communication channels for each of the set of antennas;

wherein the semiconductor die electrically couples the communication channels of the semiconductor die to the set of antennas of the conductive layer on the first surface of the substrate via the redistribution layer; and wherein a total surface area of the stiffening layer is greater than a total area of the gaps.

* * * * *